(12) United States Patent
Liu

(10) Patent No.: US 7,816,773 B2
(45) Date of Patent: Oct. 19, 2010

(54) PACKAGE STRUCTURE AND MANUFACTURING METHOD THEREOF

(75) Inventor: Chien Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 17 days.

(21) Appl. No.: 12/078,597

(22) Filed: Apr. 2, 2008

(65) Prior Publication Data
US 2008/0283984 A1 Nov. 20, 2008

(30) Foreign Application Priority Data
May 14, 2007 (TW) ............... 96117113 A

(51) Int. Cl.
*H01L 23/495* (2006.01)

(52) U.S. Cl. .............. 257/676; 257/706; 257/707; 257/778; 257/779; 257/E23.031

(58) Field of Classification Search ........... 257/675, 257/676, 706, 707, 778, 779, 780, E23.031
See application file for complete search history.

(56) References Cited

U.S. PATENT DOCUMENTS

| 6,523,608 | B1 * | 2/2003 | Solbrekken et al. ......... 165/185 |
| 6,661,087 | B2 | 12/2003 | Wu |
| 6,825,568 | B2 | 11/2004 | Hung |
| 6,876,087 | B2 * | 4/2005 | Ho et al. .................... 257/778 |
| 2005/0195681 | A1 | 9/2005 | Gembala |
| 2008/0224283 | A1 * | 9/2008 | Pu et al. .................... 257/673 |

* cited by examiner

Primary Examiner—Thien F Tran
(74) Attorney, Agent, or Firm—Bacon & Thomas, PLLC

(57) ABSTRACT

A package structure and a manufacturing method thereof are provided. The package structure includes a leadframe, a die, a solder layer and several connecting components. The leadframe includes a heat dissipation pad and several leads. The heat dissipation pad is disposed in a substantial center of the leadframe. The leads are surrounding the heat dissipation pad. The die having an active surface is disposed on the leadframe. The solder layer is disposed between the active surface and the heat dissipation pad. The connecting components are disposed between the active surface and the leads. The die is electrically connected to the leadframe through the solder layer and the connecting components.

1 Claim, 4 Drawing Sheets

PACKAGE STRUCTURE AND MANUFACTURING METHOD THEREOF

This application claims the benefit of Republic of Taiwan application Serial No. 096117113, filed May 14, 2007, the subject matter of which is incorporated herein by reference.

BACKGROUND OF THE INVENTION

1. Field of the Invention

The invention relates in general to a package structure and a manufacturing method thereof, and more particularly to a chip package structure and a manufacturing method thereof.

2. Description of the Related Art

With the rapid development of semiconductor package technology, the chips are protected by the package technology, such that the package technology could avoid the chips being moisturized, and enable the internal wire of the chips to be electrically connected to the wire of printed circuit board.

Please refer to FIG. 1. FIG. 1 is a cross-sectional view of a conventional package structure. The package structure 10 at least includes a die 11, a leadframe 12, several solder bumps 13 and a molding compound 14. The die 11 is electrically connected to the leadframe 12 through several solder bumps 13. The molding compound 14 is filled into the gap between the die 11 and the leadframe 12 by a mold press. The molding compound 14 encapsulates the die 11, the leadframe 12 and several solder bumps 13 for preventing the die 11 from being moisturized and oxidized or damaged.

The molding compound 14 can be injected into the gap between the die 11 and the leadframe 12 by a mold press or filled in the narrow gaps between the solder bumps 13 through fluid capillarity. If the gaps between the solder bumps 13 are too small, the molding compound 14 is unable to fill the gaps, so as to end up with failure in package process and reduce the yield rate. Besides, the die 11 is bonded with the leadframe 12, the solder bumps 13 may collapse, such that the molding compound 14 unable to fill the gaps.

As the heat generated by the die 11 during operation is dissipated through the solder bumps 13 only, the efficiency of dissipation is limited. Thus, the chip may be burnt easily and lifespan of the chip is shortened. Therefore, how to improve the conventional package structure and resolve the above problems has become an imminent issue to be resolved.

SUMMARY OF THE INVENTION

The invention is directed to a package structure and a manufacturing method. The solder layer enables the die to be bonded to the leadframe, so that the heat dissipation efficiency of the die in the package structure is improved.

According to a first aspect of the present invention, a package structure including a leadframe, a die, a solder layer and several connecting components is provided. The leadframe includes a heat dissipation pad and several leads. The heat dissipation pad is disposed in a substantial center of the leadframe. The leads surround the heat dissipation pad. The die having an active surface is disposed on the leadframe. The solder layer is disposed between the active surface and the heat dissipation pad. The connecting components are disposed between the active surface and the leads. The die is electrically connected to the leadframe through the solder layer and the connecting components.

According to a second aspect of the present invention, a manufacturing method of a package structure is provided. Firstly, a die having an active surface is provided. Next, a solder layer is formed in a substantial center of the active surface. Then, several connecting components surrounding the solder layer in array are disposed. After that, a leadframe is provided. Then, the die is bonded to the leadframe through the connecting components and the solder layer.

The invention will become apparent from the following detailed description of the preferred but non-limiting embodiments. The following description is made with reference to the accompanying drawings.

DETAILED DESCRIPTION OF THE INVENTION

A package structure and a manufacturing method thereof are provided. The package structure includes a leadframe, a die, a solder layer and several connecting components. The leadframe includes a heat dissipation pad and several leads. The heat dissipation pad is disposed in a substantial center of the leadframe. The leads surround the heat dissipation pad. The die having an active surface is disposed on the leadframe. The solder layer is disposed between the active surface of the die and the heat dissipation pad. The connecting components are disposed between the active surface of the die and the leads. The die is electrically connected to the leadframe through the solder layer and the connecting components. In the package structure, the die is connected to the leadframe through the solder layer and connecting components for dissipating the heat through the solder layer and the connecting components, so that the heat dissipation efficiency of the die is improved.

Figure 2:
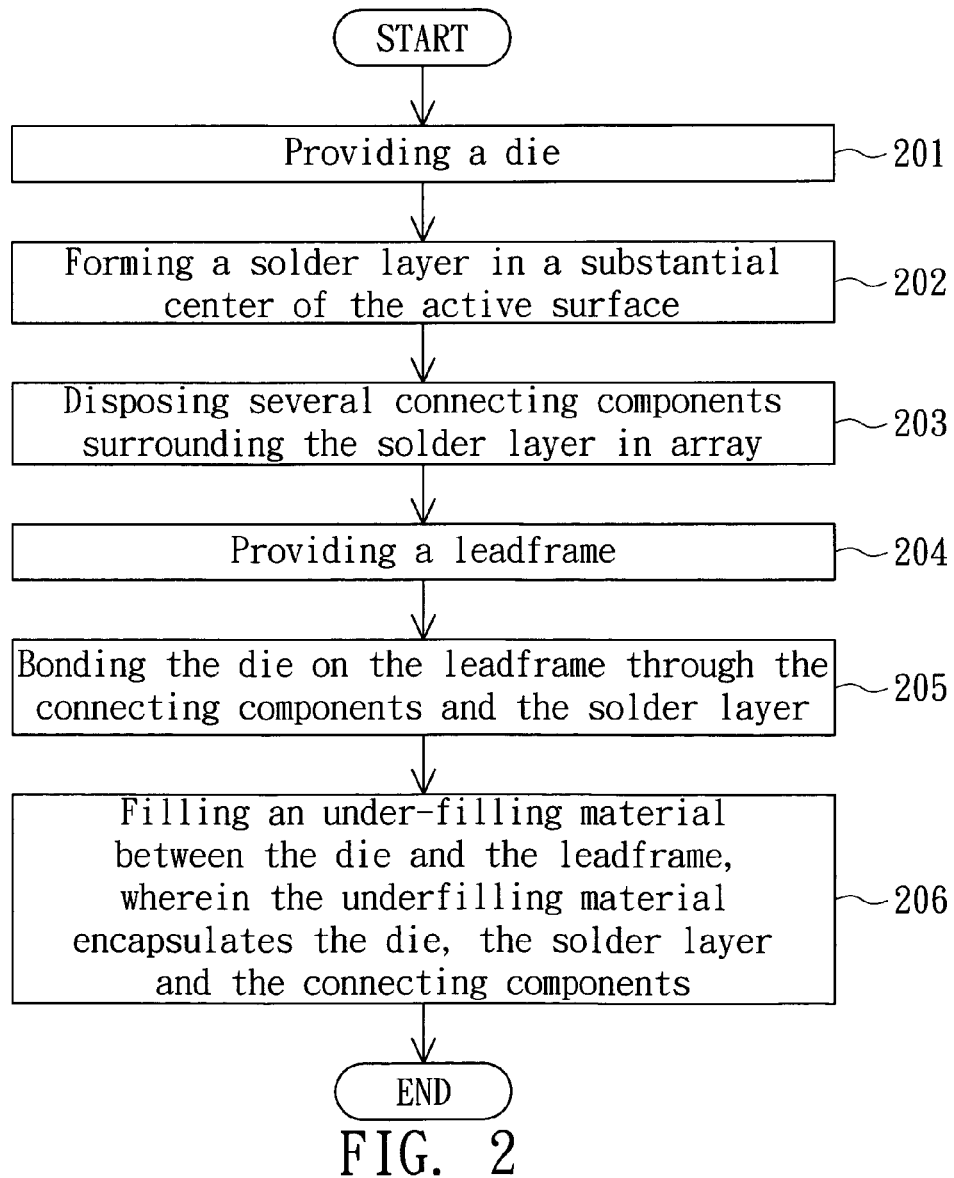
FIG. 2 is a flowchart of a manufacturing method of a package structure according to a preferred embodiment of the invention.

The manufacturing method of package structure of the present embodiment of the invention is disclosed below. Please refer to FIG. 2. FIG. 2 is a flowchart of a manufacturing method of a package structure according to a preferred embodiment of the invention.

Figure 3A:
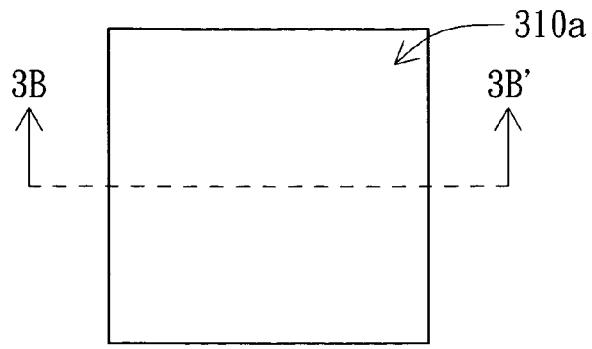
FIG. 3A is a perspective of a die according to a preferred embodiment of the invention.
Figure 3B:
FIG. 3B is a cross-sectional view along the cross-sectional line 3B-3B' of FIG. 3A.

Please refer to both FIGS. 3A and 3B. FIG. 3A is a perspective of a die according to a preferred embodiment of the invention. FIG. 3B is a cross-sectional view along the cross-sectional line 3B-3B' of FIG. 3A. The manufacturing method of package structure 300 includes the following steps. Firstly, the method begins at step 201 of FIG. 2, a die 310 having an active surface 310a is provided.

Figure 4A:
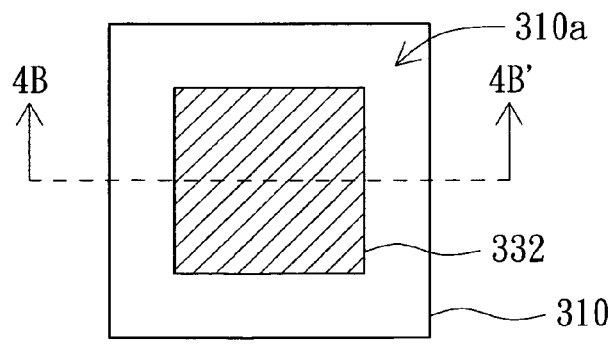
FIG. 4A is a perspective of a solder layer formed on the die of FIG. 3A.
Figure 4B:
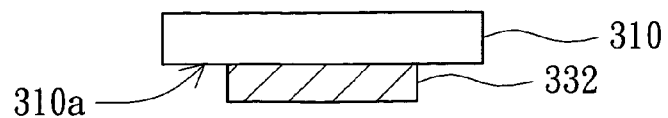
FIG. 4B is a cross-sectional view along the cross-sectional line 4B-4B' of FIG. 4A.

Next, please refer to both FIGS. 4A and 4B. FIG. 4A is a perspective of a solder layer formed on the die of FIG. 3A. FIG. 4B is a cross-sectional view along the cross-sectional line 4B-4B' of FIG. 4A. As indicated in step 202 of FIG. 2, a solder layer 332 is formed in a substantial center of the active surface 310a. In the present embodiment of the invention, the solder layer 332 is formed in a substantial center of the active surface 310a by way of solder paste printing.

Figure 5A:
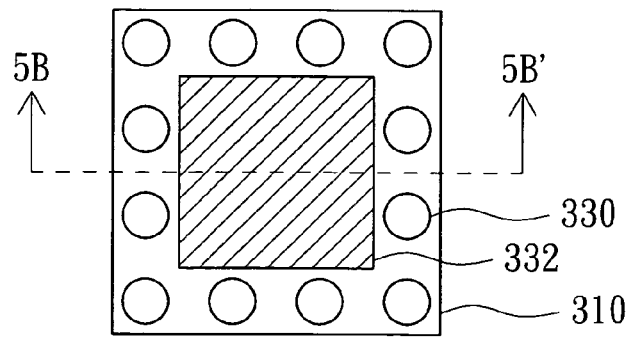
FIG. 5A is a perspective of connecting components formed on the die of FIG. 4A.
Figure 5B:
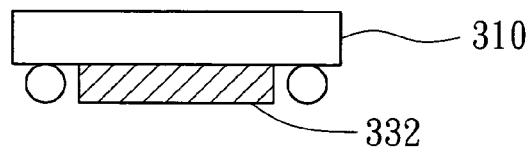
FIG. 5B is a cross-sectional view along the cross-sectional line 5B-5B' of FIG. 5A.

Then, please refer to both FIGS. 5A and 5B. FIG. 5A is a perspective of connecting components formed on the die of FIG. 4A. FIG. 5B is a cross-sectional view along the cross-sectional line 5B-5B' of FIG. 5A. As indicated in step 203 of FIG. 2, several connecting components 330 surrounding the solder layer 332 in array are disposed. In the present embodiment of the invention, the connecting components 330 are exemplified as solder bumps, the connecting components 330 surround the solder layer 332 in array. Besides, the material of the connecting components 330 is preferably the same with that of the solder layer 332. In the present embodiment of the invention, the connecting components 330 and the solder layer 332 are made of tin-lead alloy or lead free solder.

Figure 6A:
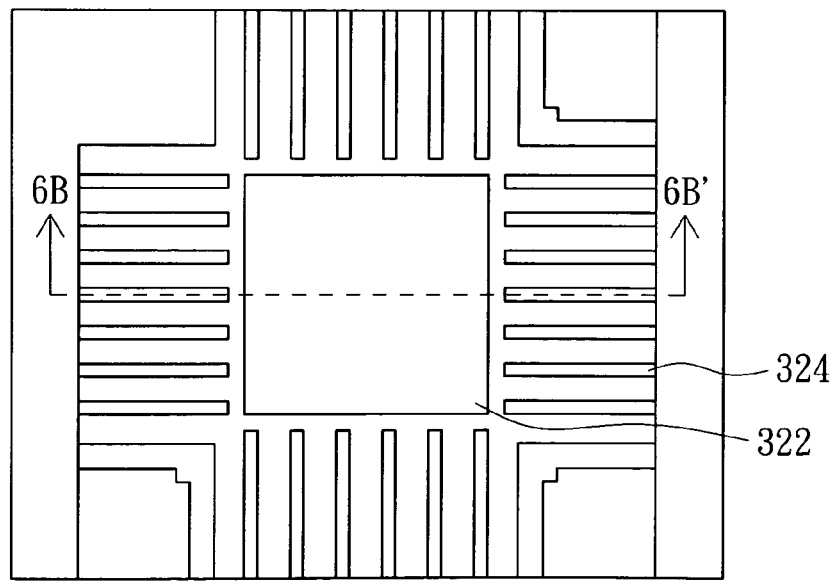
FIG. 6A is a perspective of a leadframe according to a preferred embodiment of the invention.
Figure 6B:
FIG. 6B is a cross-sectional view along the cross-sectional line 6B-6B' of FIG. 6A.

Then, please refer to both FIGS. 6A and 6B. FIG. 6A is a perspective of a leadframe according to a preferred embodiment of the invention. FIG. 6B is a cross-sectional view along the cross-sectional line 6B-6B' of FIG. 6A. Next, the manufacturing method proceeds to step 204, a leadframe 320, which includes a heat dissipation pad 322 and several leads 324, is provided. The heat dissipation pad 322 is disposed in a substantial center of the leadframe 320. The leads 324 surround the heat dissipation pad 322. In the present embodiment of the invention, the leadframe 320 is made of a metallic material for providing support and conductivity.

Figure 7A:
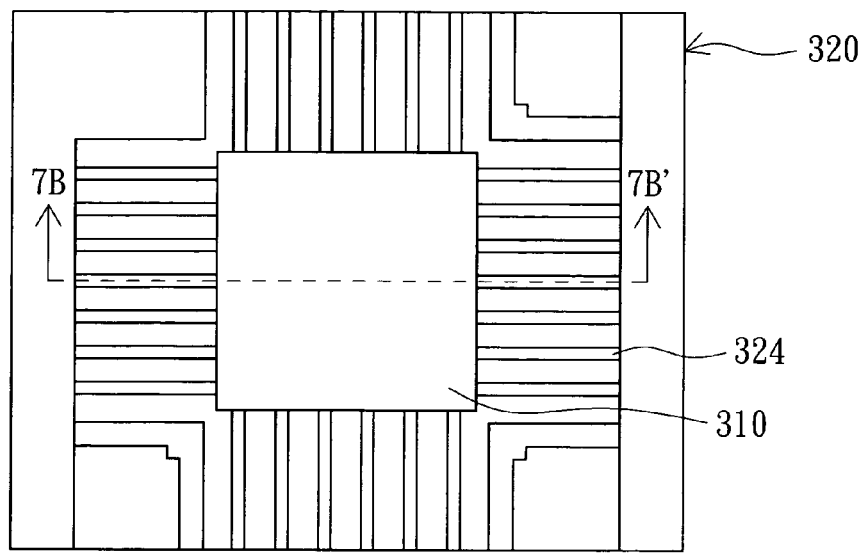
FIG. 7A is a perspective of a die bonded to the leadframe of FIG. 6A.
Figure 7B:
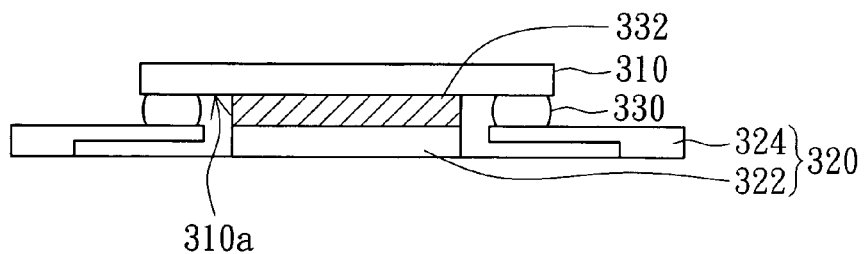
FIG. 7B is a cross-sectional view along the cross-sectional line 7B-7B' of FIG. 7A.

After that, please refer to both FIG. 7A and FIG. 7B. FIG. 7A is a perspective of a die bonded to the leadframe of FIG. 6A. FIG. 7B is a cross-sectional view along the cross-sectional line 7B-7B' of FIG. 7A. As indicated in step 205 of FIG. 2, the active surface 310a of the die 310 is bonded to the leadframe 320 through the connecting components 330 and the solder layer 332. The die 310 tightly contacts with the heat dissipation pad 322 through the solder layer 332 and the die 310 bonds on the leads 324 of the leadframe 320 through the connecting components 330. In the present embodiment of the invention, the area of the solder layer 332 is substantially the same with that of the heat dissipation pad 322. Besides, the connecting components 330 and the solder layer 332 are made of tin-lead alloy or lead free solder.

Figure 8:
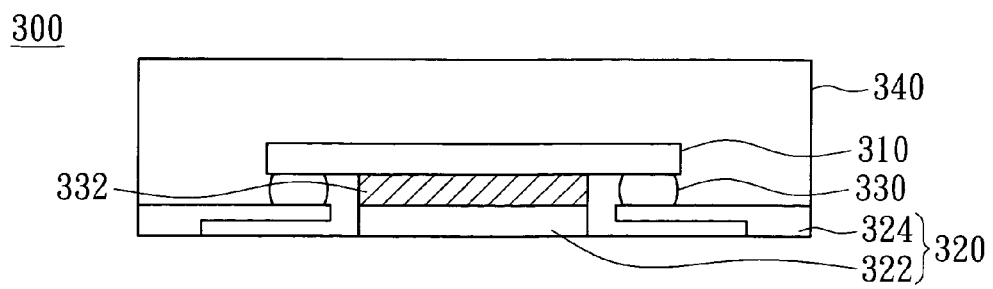
FIG. 8 is a cross-sectional view of filling an encasulant into the package structure of FIG. 7B.

Next, the manufacturing method proceeds to the step of disposing an encasulant as indicated in step 206. Please refer to FIG. 8. FIG. 8 is a cross-sectional view of disposing an encasulant into the package structure of FIG. 7B. The encasulant 340 is disposed between the die 310 and the leadframe 320 for encapsulating the die 310, the solder layer 332 and connecting components 330. In the present embodiment of the invention, a resin filled between the die 310 and the leadframe 320 by a mold press are exemplified as the encasulant 340. Then, The encasulant 340 is filled into the gap between the leadframe 320 and the die 310 through liquid capillarity. By disposing the solder layer 322 on the die 310, the number of connecting components 330 is substantially reduced such that the gap between the connecting components is substantially reduced. Thus, the problem that the encasulant 340 cannot fill the gap is resolved, largely improving the filling yield rate of the encasulant 340. Moreover, in the present embodiment of the invention, the solder layer 332 is a solid plate structure and will not collapse easily, hence increasing the yield rate of the manufacturing process.

Figure 1:
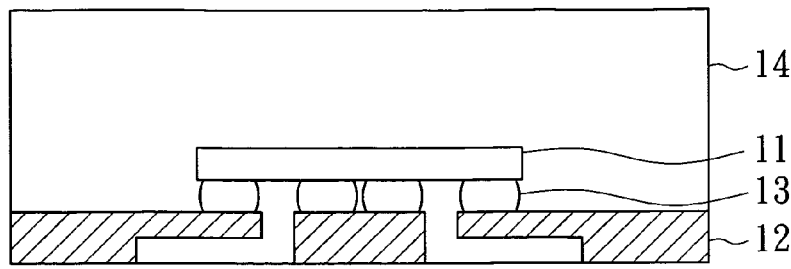
FIG. 1 (Prior Art) is a cross-sectional view of a conventional package structure.

In order to dissipate the heat generated during the operation of the die 310, as the solder layer 332 is bonded on the heat dissipation pad 322, the heat is transmitted to the leadframe 320 through the solder layer 332. As the contact area between the solder layer 332 and the die 310 is larger than the contact area between the die 11 and the leadframe 12 through the solder bumps 13 (as illustrated in FIG. 1) in a conventional package structure 100, the heat dissipation of the solder layer 332 is improved. Besides, the die 310 is grounded through the solder layer 332 and the leadframe 320, hence reducing electromagnetic interference (EMI).

According to the package structure and the manufacturing method thereof disclosed in the above embodiment of the invention, the die and the leadframe are bonded through the solder layer and connecting components, so that the thermal conductive area between the die and the leadframe is increased and the heat dissipation of the die is improved. Moreover, as the solder layer is electrically to the die and the leadframe, so that the die is grounded through the solder layer and the leadframe, and the electromagnetic interference is reduced. Besides, with the disposition of the solder layer, the number of connecting components is reduced, hence reducing the gap between the connecting components and increasing the yield rate during the manufacturing process of filling the encasulant.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure, comprising:
   a leadframe, comprising:
      a heat dissipation pad, disposed in a substantial center of the leadframe; and
      a plurality of leads, surrounding the heat dissipation pad, wherein each of the leads has a top surface and a bottom surface, and the bottom surface has a recess;
   a die, having an active surface, and a back surface opposite to the active surface, wherein the die is disposed on the heat dissipation pad and the top surfaces of the leads;
   a solder layer, disposed between the active surface and the heat dissipation pad, wherein the area of the solder layer is substantially the same with that of the heat dissipation pad;
   a plurality of connecting components, disposed between the active surface and the leads; and
   an encasulant, wherein the encasulant at least covers the back surface of the die;
   wherein, the die is electrically connected to the leadframe through the solder layer and the connecting components.

* * * * *